United States Patent
Butzmann

(10) Patent No.: US 9,362,597 B2
(45) Date of Patent: Jun. 7, 2016

(54) BATTERY MANAGEMENT UNIT COMPRISING A PLURALITY OF MONITORING UNITS

(75) Inventor: Stefan Butzmann, Beilstein (DE)

(73) Assignee: Robert Bosch GmbH, Stuttgart (DE)

(*) Notice: Subject to any disclaimer, the term of this patent is extended or adjusted under 35 U.S.C. 154(b) by 360 days.

(21) Appl. No.: 13/979,114

(22) PCT Filed: Nov. 14, 2011

(86) PCT No.: PCT/EP2011/070002
§ 371 (c)(1),
(2), (4) Date: Sep. 23, 2013

(87) PCT Pub. No.: WO2012/095202
PCT Pub. Date: Jul. 19, 2012

(65) Prior Publication Data
US 2014/0045004 A1 Feb. 13, 2014

(30) Foreign Application Priority Data
Jan. 13, 2011 (DE) .......... 10 2011 002 632

(51) Int. Cl.
*H01M 10/63* (2014.01)
*H01M 10/48* (2006.01)
*H04Q 9/00* (2006.01)
*G01R 31/36* (2006.01)

(52) U.S. Cl.
CPC ............ *H01M 10/482* (2013.01); *G01R 31/36* (2013.01); *H04Q 9/00* (2013.01); *G01R 31/3658* (2013.01); *H04Q 2209/10* (2013.01)

(58) Field of Classification Search
CPC ..... H01M 10/482; G01R 1/36; G01R 1/3658; H04Q 9/00
See application file for complete search history.

(56) References Cited

U.S. PATENT DOCUMENTS

| 5,773,962 | A | 6/1998 | Nor | |
|---|---|---|---|---|
| 7,089,098 | B2 * | 8/2006 | Rogg | G05B 19/0428 340/438 |
| 2009/0132747 | A1 * | 5/2009 | Bueti | G06F 13/4059 710/305 |
| 2010/0291427 | A1 * | 11/2010 | Zhou | B60L 11/14 429/100 |
| 2011/0089953 | A1 * | 4/2011 | Chandler | G01R 31/3658 324/427 |

FOREIGN PATENT DOCUMENTS

| DE | 10 2004 033 761 A1 | 2/2006 |
|---|---|---|
| WO | 2009/029534 A1 | 3/2009 |

OTHER PUBLICATIONS

International Search Report corresponding to PCT Application No. PCT/EP2011/070002, mailed Feb. 14, 2012 (German and English language document) (5 pages).

* cited by examiner

*Primary Examiner* — Jonathan Jelsma
(74) *Attorney, Agent, or Firm* — Maginot, Moore & Beck LLP

(57) ABSTRACT

A battery management unit includes a plurality of monitoring units. Each monitoring unit is configured to acquire at least one operating variable of at least one battery cell or of a battery module having a number of battery cells. Each monitoring unit is connected to a first bus. The battery management unit further includes a control device connected to the first bus and configured to communicate with at least one of the monitoring units of the plurality of monitoring unit via the first bus.

8 Claims, 2 Drawing Sheets

BATTERY MANAGEMENT UNIT COMPRISING A PLURALITY OF MONITORING UNITS

This application is a 35 U.S.C. §371 National Stage Application of PCT/EP2011/070002, filed on Nov. 14, 2011, which claims the benefit of priority to Serial No. DE 10 2011 002 632.0, filed on Jan. 13, 2011 in Germany, the disclosures of which are incorporated herein by reference in their entirety.

The present disclosure relates to a battery management unit comprising a plurality of monitoring units, to a battery having the battery management unit according to the disclosure and to a motor vehicle having the battery according to the disclosure.

BACKGROUND

Batteries which use lithium-ion or nickel-metal hydride technology and have a large number of electrochemical battery cells connected in series are used nowadays, especially in hybrid and electric vehicles. A battery management unit is used to monitor the battery and, in addition to monitoring safety, is intended to provide the longest possible service life. For this purpose, the voltage of each individual battery cell is measured together with the battery current and the battery temperature and the state is estimated (for example the state of charge or the aging state of the battery). In order to maximize the service life, it helps to know the currently given maximum capacity of the battery, that is to say the maximum electrical power which can be delivered or consumed, at any time. If this capacity is exceeded, the aging of the battery can be greatly accelerated.

In order to make it possible to accurately measure the voltage of each individual battery cell or at least the voltage of each battery module which comprises a predetermined number of battery cells, battery management units are known from the prior art, which units comprise a plurality of series-connected monitoring chips, that is to say integrated circuits, which can carry out voltage measurements, among other things, and are connected in the form of a daisy chain to a first bus which enables communication between the individual monitoring units without requiring DC isolation or the use of high-voltage electronics. In this context, the monitoring units are located with their supply voltages, which are delivered by the battery cells or battery modules to be monitored, in a voltage chain and communicate with one another in such a manner that each monitoring unit communicates only with an adjacent monitoring unit and forwards the communication data which come from monitoring units, which have a higher voltage level, to the monitoring unit which is in each case lower in terms of the voltage level.

A base monitoring unit which is likewise connected to the first communication bus and can receive messages from each of the monitoring units is arranged at that end of the communication bus which is lowest with regard to the voltage level. In addition, the base monitoring unit is connected via a second bus to a control device which receives the forwarded data via this bus. DC isolation is usually provided between the base monitoring unit and the control device.

The monitoring units are usually placed in the vicinity of the battery modules associated with them and the connections for communication via the first bus and the second bus are implemented by installing cable harnesses.

Application-specific integrated circuits (ASIC) which can be configured in accordance with the modular principle either as a base monitoring unit at the lower end of the voltage chain—that is to say with an interface for communicating with the control device and an interface for communicating with a further monitoring unit in a voltage chain—or also as a monitoring unit in the daisy chain are known from the prior art.

Whereas the first bus which is used for first communication between the individual monitoring units is usually designed for reduced EMC (electromagnetic compatibility) emission and an increased resistance to irradiation, the second bus which is used for communication with the control device is usually a standardized and non-proprietary bus which is suitable for communication with a microcontroller included in the control device. In this case, use is often made of a protocol which, from the point of view of electromagnetic compatibility, is not intended to be routed over a relatively long distance via a cable.

SUMMARY

The disclosure provides a battery management unit comprising a plurality of monitoring units. Each of the monitoring units is designed to record at least one operating variable of at least one battery cell. In addition, each of the monitoring units is connected to a first bus. The battery management unit also comprises a control device which is likewise connected to the first bus and is designed to communicate with at least one of the monitoring units via the first bus.

It is preferred for the control device to comprise a microcontroller and a translation unit, the translation unit being connected to the first bus and being designed to communicate with at least one of the monitoring units via the first bus, and the microcontroller and the translation unit being connected to a second bus and being designed to communicate with one another via the second bus.

The translation unit may be designed to communicate via the first bus using a first bus protocol and via the second bus using a second bus protocol which differs from the first protocol.

A bus protocol which makes it possible to route the cables belonging to the first bus over a relatively long distance between different printed circuit boards associated with individual battery cells or battery modules and is selected in such a manner that it is stable with respect to electromagnetic compatibility and is sufficiently robust with respect to interfering radiation is typically used as the first bus protocol which is used for communication between the individual monitoring units and is used to forward their data to the translation unit. This is often a differential, non-standardized protocol.

In contrast, a protocol which is standardized and is not designed to be routed over a relatively long distance on a cable is typically used as the second bus protocol which is used for communication between the translation unit and the microcontroller. Examples of these are an SPI (Serial Peripheral Interface) bus, an I²C (Inter-Integrated Circuit) bus or a CAN (Controller Area Network) bus. Such a protocol generates a high degree of emission with regard to electromagnetic compatibility since high data rates are often transmitted without a differential bus. On the other hand, the protocol which is typically used is sensitive to electromagnetic irradiation since the data are transmitted in a single-ended manner. If additive interference signals which come from an external interference source are on a cable of the second bus in this case, this may result in the second bus protocol no longer being understood by the connected components.

As a result of the fact that the translation unit and the microcontroller are arranged together in the control device, the second bus does not need to be laid over long distances and may be arranged in such a manner that it is protected from electromagnetic irradiation and emission.

It is also preferred for at least some of the monitoring units to be connected to the first bus in a daisy chain topology.

At least some of the monitoring units may be designed, in particular, to record a voltage of a battery cell or battery module.

At least some of the monitoring units may be integrated circuits. The same applies to the translation unit. It is particularly advantageous if at least some of the monitoring units and also the translation unit are structurally identical parts, in particular structurally identical integrated circuits which are configured as intended. The components are typically configurable application-specific integrated circuits (ASIC).

Another aspect of the disclosure relates to a battery having a battery management unit according to the disclosure, preferably a lithium ion battery, and a motor vehicle having a battery according to the disclosure.

BRIEF DESCRIPTION OF THE DRAWINGS

Exemplary embodiments of the disclosure are explained in more detail using the drawings and the following description. In the drawings.

DETAILED DESCRIPTION

Figure 1:
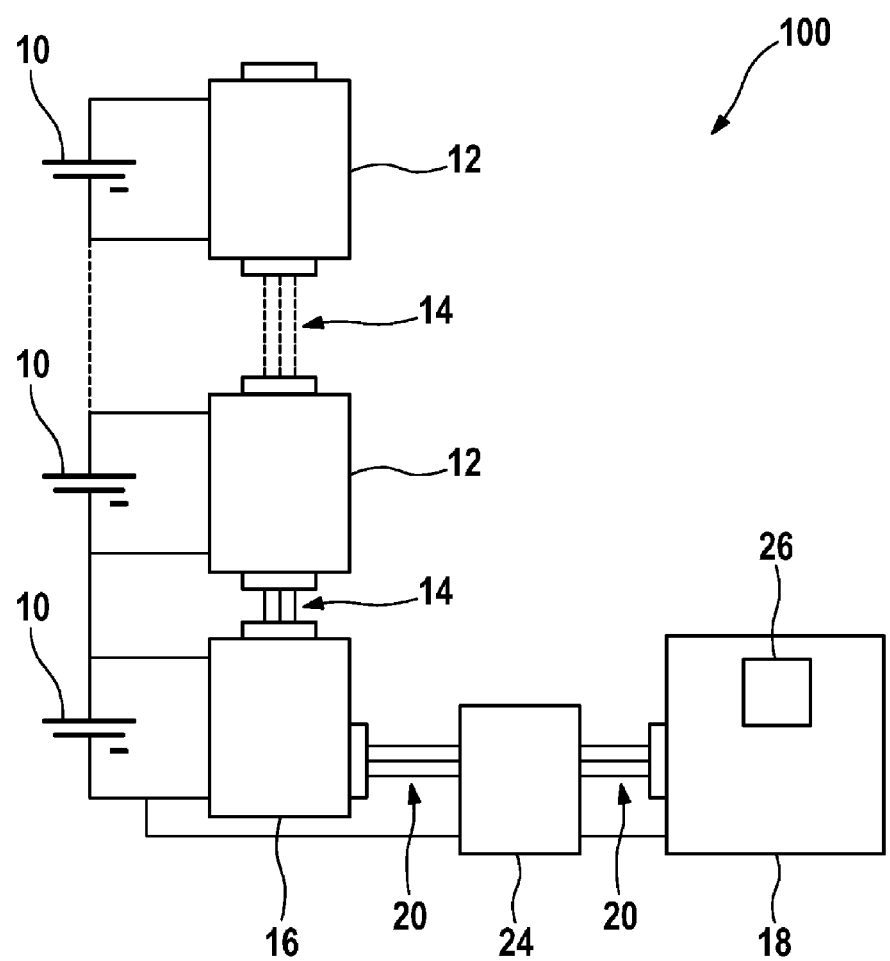
FIG. 1 shows a battery management unit according to the prior art.

FIG. 1 shows a battery management unit according to the prior art which is part of a battery denoted overall with 100. The battery management unit comprises a plurality of monitoring units 12 which are connected to a first bus 14 in a daisy chain topology. Each of the monitoring units 12 is designed to record a voltage applied to a battery module 10 associated with it, the battery module 10 comprising a predetermined number of battery cells, for example six to twelve battery cells (only schematically illustrated in FIG. 1). In this case, the recorded voltage is supplied to an analog/digital converter via a multiplexer and the digitized voltage is then transmitted to the first bus 14. The battery module 10 may also comprise only one battery cell, in which case the monitoring unit 12 associated with the battery cell measures the individual voltage across the battery cell.

The plurality of battery modules 10 are connected in series. Each battery module 10 provides a supply voltage to the monitoring unit 12 associated with it, with the result that the plurality of monitoring units 12 are in an ascending voltage chain.

Each monitoring unit 12 receives, via the first bus 14, data from a monitoring unit 12 which is possibly superordinate to it in the voltage chain and forwards the received data, together with data produced by itself, to the adjacent monitoring unit 12 which is lower in the voltage chain. Arranged at the lower end of the voltage chain is a base monitoring unit 16 which receives all forwarded data which come from the monitoring units 12 and forwards said data, via a second bus 20 to which it is connected, to a control device 18 which is likewise connected to the second bus 20 and comprises a microcontroller 26.

Each monitoring unit 12 is arranged on its own printed circuit board which is arranged in the vicinity of the battery module 10 associated with it. The monitoring units 12 and the base monitoring unit 16 are structurally identical application-specific integrated circuits which can be configured as intended, with the result that they can communicate with the other structurally identical parts, as described.

The first bus 14 uses a differential protocol which is selected, with respect to robustness and electromagnetic compatibility, in such a manner that the cables of the first bus 14 can be routed over a relatively long distance and over a plurality of printed circuit boards without interfering with communication on the first bus 14.

In contrast, a bus protocol which is transmitted in a single-ended manner and is optimized for communication with the microcontroller 26 is used on the second bus 20. Such a protocol is more susceptible to interference with regard to electromagnetic compatibility and, in particular, is not designed to be transmitted over a relatively long distance of a cable. The disadvantage of the arrangement illustrated in FIG. 1 is that considerable distances may need to be bridged from the base monitoring unit 16 to the control device 18 depending on the design of the battery 100, since typically both components are arranged on different printed circuit boards.

A DC isolation unit 24 isolates the base monitoring unit 16 and a first part of the second bus 20 from one another, on the one hand, and isolates a second part of the second bus 20 and the control device 18 from one another, on the other hand. A voltage supply for the first part of the second bus 20 is also provided in the DC isolation unit 24.

Figure 2:
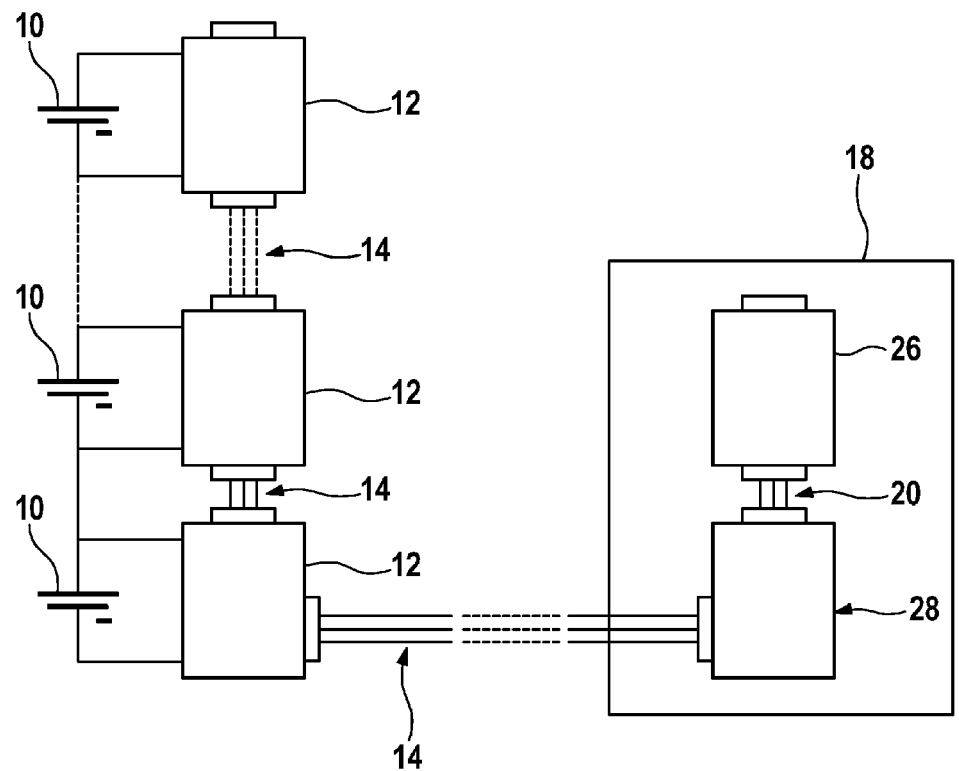
FIG. 2 shows a battery management unit according to one embodiment of the disclosure.

FIG. 2 shows a battery management unit according to one embodiment of the disclosure. In contrast to the battery management unit according to the prior art, as illustrated in FIG. 1, the battery management unit according to the disclosure has a control device 18 which, in addition to the microcontroller 26, comprises a translation unit 28 which is connected to the first bus 14 and communicates with the monitoring unit 12 which is lowest in the voltage chain via said first bus. The microcontroller 26 and the translation unit 28 communicate with one another via the second bus 20 to which both are connected. The monitoring units 12 and the translation unit 28 are structurally identical application-specific integrated circuits which can be configured as intended, with the result that they can communicate with the other structurally identical parts, as described.

The task of the translation unit 28 is to transmit messages from the first bus 14 to the second bus 20 inside the control device 18 and thus to translate from the protocol used on the first bus 14 to the protocol used on the second bus 20.

The arrangement according to the disclosure can be achieved by modifying the arrangement shown in FIG. 1 by moving the base monitoring unit 16 shown in FIG. 1 into the control device 18, with the result that it can be used as the translation unit 28. However, unlike the base monitoring unit 16 shown in FIG. 1, the translation unit 28 is not associated with any battery module 10. Rather, only the other monitoring units 12 are each associated with a battery module 10, the voltage of which is measured by the monitoring units. As a result of the fact that the translation unit 28 is not associated with a battery module but rather undertakes the task of an auxiliary circuit, there is no need to route measuring cables from a battery module to the control device 18.

The translation unit 28 receives the data forwarded by the monitoring units 12 arranged in the daisy chain topology via the first bus 14 and transmits said data to the microcontroller 26 via the second bus 20. As a result of the fact that both the translation unit 28 and the microcontroller 26 are arranged in the control device 18, it is possible to keep the distance of the second bus 20 running between the microcontroller 26 and the translation unit 28 very small, with the result that the bus is protected from electromagnetic irradiation and emission. The possibly large distance between the monitoring unit 12 which is lowest in the voltage chain and the translation unit 28 is bridged via a part of the first bus 14 which uses a protocol designed to be routed over a relatively long distance via a cable.

The invention claimed is:

1. A battery management unit comprising:
   a plurality of monitoring units, each monitoring unit of the plurality of monitoring units being configured to record at least one operating variable of at least one battery cell, and each monitoring unit of the plurality of monitoring units being connected to a first bus; and
   a control device having a microcontroller and a translation unit, the translation unit being connected to the first bus and configured to communicate with at least one of the monitoring units of the plurality of monitoring units via the first bus, the microcontroller being connected to the translation unit via a second bus and configured to communicate with the translation unit via the second bus,
   wherein the translation unit and at least some of the monitoring units of the plurality of monitoring units are structurally identical integrated circuits.

2. The battery management unit as claimed in claim 1, wherein:
   the translation unit is configured (i) to communicate via the first bus using a first bus protocol, and (ii) to communicate via the second bus using a second bus protocol, and the first bus protocol is a differential bus protocol.

3. The battery management unit as claimed in claim 1, wherein the second bus is located entirely within an enclosure of the control device to be protected from electromagnetic irradiation and emission.

4. The battery management unit as claimed in claim 1, wherein at least some of the monitoring units of the plurality of monitoring units are connected to the first bus in a daisy chain topology.

5. The battery management unit as claimed in claim 1, wherein at least some monitoring units of the plurality of monitoring units are configured to record a voltage of one of the battery cells or of the battery module.

6. A battery comprising:
   a plurality of battery cells; and
   a battery management unit including a plurality of monitoring units and a control device, each monitoring unit of the plurality of monitoring units being configured to record at least one operating variable of at least one battery cell of the plurality of battery cells, each monitoring unit of the plurality of monitoring units being connected to a first bus, and the control device having a microcontroller and a translation unit, the translation unit being connected to the first bus and configured to communicate with at least one of the monitoring units of the plurality of monitoring units via the first bus, the microcontroller being connected to the translation unit via a second bus and configured to communicate with the translation unit via the second bus, the translation unit and at least some of the monitoring units of the plurality of monitoring units being structurally identical integrated circuits.

7. The battery as claimed in claim 6, wherein the battery is included in an electric motor vehicle.

8. A method for improving the electromagnetic compatibility in a battery management unit including a plurality of monitoring units and a control device, each monitoring unit of the plurality of monitoring units and the control device being connected to a first bus, comprising:
   recording at least one operating variable of at least one battery cell with each monitoring unit of the plurality of monitoring units;
   receiving the at least on operating variable from at least one monitoring unit of the plurality of monitoring units via the first bus using a translation unit of the control device, the translation unit being connected to the first bus, the translation unit and at least some of the monitoring units of the plurality of monitoring units being structurally identical integrated circuits; and
   processing the at least on operating variable using a microcontroller of the control device, the microcontroller being connected to the translation unit via a second bus and configured to communicate with the translation unit via the second bus.

* * * * *